United States Patent
Morgan

(10) Patent No.: US 6,955,995 B2
(45) Date of Patent: *Oct. 18, 2005

(54) METHODS OF CLEANING SURFACES OF COPPER-CONTAINING MATERIALS, AND METHODS OF FORMING OPENINGS TO COPPER-CONTAINING SUBSTRATES

(75) Inventor: Paul A. Morgan, Kuna, ID (US)

(73) Assignee: Mircon Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/683,801

(22) Filed: Oct. 10, 2003

(65) Prior Publication Data

US 2004/0110372 A1 Jun. 10, 2004

Related U.S. Application Data

(63) Continuation of application No. 09/579,333, filed on May 25, 2000, now Pat. No. 6,653,243.

(51) Int. Cl.[7] .................. H01L 21/302; H01L 21/4763; B08B 6/00
(52) U.S. Cl. ................ 438/745; 438/756; 438/757; 438/637; 134/1.3
(58) Field of Search ............................. 438/745, 757, 438/637, 756; 134/1.3

(56) References Cited

U.S. PATENT DOCUMENTS

| | | | |
|---|---|---|---|
| 3,831,265 A | 8/1974 | Louzon et al. ............. 29/592.1 |
| 4,415,606 A | 11/1983 | Cynkar et al. |
| 4,938,257 A | 7/1990 | Morris ...................... 134/64 R |
| 5,017,267 A | 5/1991 | Cordani ........................ 216/95 |
| 5,213,622 A | 5/1993 | Bohling et al. ................. 134/3 |
| 5,382,296 A | 1/1995 | Anttila ........................... 134/3 |
| 5,633,121 A | 5/1997 | Namiki et al. ............... 430/313 |
| 5,681,398 A | 10/1997 | Muraoka ......................... 134/3 |
| 5,861,076 A | 1/1999 | Adlam et al. ................ 156/281 |
| 5,863,344 A | 1/1999 | Nam ........................... 134/1.3 |
| 5,939,334 A | 8/1999 | Nguyen et al. |
| 6,083,840 A | 7/2000 | Mravic et al. .............. 438/693 |
| 6,124,214 A | 9/2000 | Hembree et al. |
| 6,136,767 A | 10/2000 | Hineman et al. ........... 510/176 |
| 6,143,658 A | 11/2000 | Donnelly, Jr. et al. ...... 438/687 |
| 6,204,169 B1 | 3/2001 | Bajaj et al. |
| 6,232,228 B1 | 5/2001 | Kwag et al. |
| 6,319,543 B1 | 11/2001 | Soutar et al. .................. 427/98 |
| 6,361,712 B1 | 3/2002 | Honda et al. ............... 252/79.3 |
| 6,362,106 B1 | 3/2002 | Kaufman et al. |
| 6,391,794 B1 | 5/2002 | Chen et al. .................. 438/745 |
| 6,541,391 B2 | 4/2003 | Smith et al. ................. 438/754 |
| 6,589,882 B2 | 7/2003 | Andreas et al. ............. 438/745 |
| 6,599,370 B2 | 7/2003 | Skee |

OTHER PUBLICATIONS

Walker. P. et., "Handbrook of Metal Etchants", CRC Press 1991, pp. 90–91.

*Primary Examiner*—Ha Tran Nguyen
(74) *Attorney, Agent, or Firm*—Wells St. John P.S.

(57) ABSTRACT

The invention encompasses a semiconductor processing method of cleaning a surface of a copper-containing material by exposing the surface to an acidic mixture comprising Cl$^-$, NO$_3^-$ and F$^-$. The invention also includes a semiconductor processing method of forming an opening to a copper-containing substrate. Initially, a mass is formed over the copper-containing substrate. The mass comprises at least one of a silicon nitride and a silicon oxide. An opening is etched through the mass and to the copper-containing substrate. A surface of the copper-containing substrate defines a base of the opening, and is referred to as a base surface. The base surface of the copper-containing substrate is at least partially covered by at least one of a copper oxide, a silicon oxide or a copper fluoride. The base surface is cleaned with a cleaning solution comprising hydrochloric acid, nitric acid and hydrofluoric acid to remove at least some of the at least one of a copper oxide, a silicon oxide or a copper fluoride from over the base surface.

12 Claims, 2 Drawing Sheets

METHODS OF CLEANING SURFACES OF COPPER-CONTAINING MATERIALS, AND METHODS OF FORMING OPENINGS TO COPPER-CONTAINING SUBSTRATES

CROSS REFERENCE TO RELATED APPLICATION

This is a continuation application of U.S. patent application Ser. No. 09/579,333, which was filed May 25, 2000 now U.S. Pat. No. 6,653,243.

TECHNICAL FIELD

The invention pertains to methods of cleaning surfaces of copper-containing materials. In particular embodiments, the invention pertains to semiconductor processing methods of forming openings to copper-containing substrates.

BACKGROUND OF THE INVENTION

Copper has a relatively high conductance compared to many other elements, and accordingly can be desired for utilization as a wiring layer in various circuitry applications. For instance, in semiconductor processing applications, it can be desired to provide copper wiring layers as electrical paths to various integrated circuit components.

A difficulty in utilizing copper in semiconductor processing applications is that it can be difficult to clean. For instance, copper-containing materials will frequently have a surface to which electrical connection with other conductive components is ultimately to occur. Formation of such electrical connection will frequently involve providing a conductive material over the surface of the copper-containing material. The conductive material is intended to physically contact the surface of the copper-containing material to form an electrical connection with the copper-containing material. However, if the surface of the copper-containing material is partially or entirely covered with debris, the physical connection of the conductive material and copper surface can be impaired. Such impairment can lead to attenuation of electrical current passing between the copper-containing layer and the conductive material formed thereover.

It would be desirable to develop improved methods of cleaning copper-containing surfaces to remove debris from over the surfaces prior to forming conductive materials thereon.

SUMMARY OF THE INVENTION

In one aspect, the invention encompasses a semiconductor processing method of cleaning a surface of a copper-containing material by exposing the surface to an acidic mixture comprising $Cl^-$, $NO_3^-$ and $F^-$.

In another aspect, the invention includes a semiconductor processing method of forming an opening to a copper-containing substrate. Initially, a mass is formed over the copper-containing substrate. The mass comprises at least one of a silicon nitride and a silicon oxide. An opening is etched through the mass and to the copper-containing substrate. A surface of the copper-containing substrate defines a base of the opening, and is referred to as a base surface. The base surface of the copper-containing substrate is at least partially covered by at least one of a copper oxide, a silicon oxide or a copper fluoride. The base surface is cleaned with a cleaning solution comprising hydrochloric acid, nitric acid and hydrofluoric acid to remove at least some of the at least one of a copper oxide, a silicon oxide or a copper fluoride from over the base surface.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
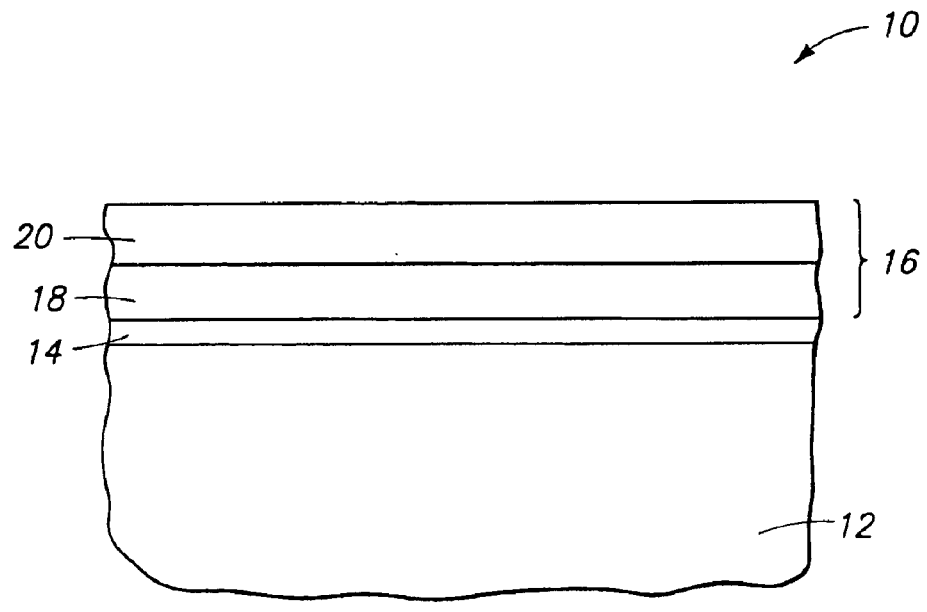
FIG. 1 is a diagrammatic, fragmentary, cross-sectional side view of a semiconductor wafer fragment at a preliminary step of a processing method of the present invention.

This disclosure of the invention is submitted in furtherance of the constitutional purposes of the U.S. Patent Laws "to promote the progress of science and useful arts" (Article 1, Section 8).

The invention encompasses utilization of a mixture comprising $Cl^-$, $NO_3^-$ and $F^-$ for cleaning surfaces of copper-containing materials. Such mixture can be formed by, for example, combining an HCl solution (which can be obtained as, for example, a 36% (by weight) solution of HCl in water), an HF solution (which can be obtained as, for example, a 49% (by weight) solution of HF in water), an $HNO_3$ solution (which can be obtained as, for example, a 70% (by weight) solution of $HNO_3$ in water) and $H_2O$. The acidic mixture can thus be a cleaning solution comprising hydrochloric acid, nitric acid and hydrofluoric acid.

If the cleaning solution is made by mixing water with the above-described 36% hydrochloric acid solution, 49% hydrofluoric acid solution, and 70% nitric acid solution, the relative amounts of the combined water and solutions can be, for example, as follows. The hydrochloric acid solution can be provided to a concentration so that there are from about 2½ parts of water added per 1 part HCl solution to about 10 parts of water added per 1 part of HCl solution. The nitric acid solution can be provided so that there are from about 75 parts of water added per 1 part nitric acid solution to about 300 parts of water added per 1 part nitric acid solution. The hydrofluoric acid solution can be provided so that there are from about 150 parts of water added per 1 part hydrofluoric acid solution to about 600 parts of water added per 1 part of hydrofluoric acid solution. A preferred composition will comprise about 300 parts of water combined with about 60 parts of HCl solution, about 2 parts of nitric acid solution, and about 1 part of hydrofluoric acid solution.

The mixtures formed by the above-described combinations will preferably consist essentially of $Cl^-$, $NO_3^-$, and $F^-$, together with equilibrium components of $H_3O^+$ and $H_2O$. The equilibrium components of $H_3O^+$ and $H_2O$ will be understood by persons of ordinary skill in the art to comprise chemicals in equilibrium with $H_3O^+$ and $H_2O$, such as, for example, $OH^-$ (i.e., the hydroxide anion). As is known to persons of ordinary skill in the art, there is some concentration of hydroxide anion present in aqueous solutions, even at acidic pHs. Another way of describing a mixture of the present invention is as an aqueous mixture comprising non-aqueous components consisting essentially of $Cl^-$, $NO_3^-$ and $F^-$, or, in particular embodiments, comprising non-aqueous components consisting of $Cl^-$, $NO_3^-$ and $F^-$.

Such description considers the equilibrium components of $H_3O^+$ and $H_2O$ to be aqueous components of the mixture. Yet another way of describing a mixture of the present invention is that such mixture is a solution in which the only non-hydroxide anions consist essentially of $Cl^-$, $NO_3^-$ and $F^-$, or in particular embodiments, consist of $Cl^-$, $NO_3^-$ and $F^-$.

An advantage of using an acidic solution comprising $Cl^-$, $NO_3^-$ and $F^-$ for cleaning copper in semiconductor fabrication processes is that such solution can remove a variety of common contaminants in a single processing step. For instance, hydrochloric acid can remove copper oxides (such as, for example, $Cu_2O$ and $CuO$), hydrofluoric acid can remove silicon oxides (for example, $SiO_2$), as well as copper oxides; and nitric acid can remove elemental copper. The acidic solution of the present invention can also remove copper fluorides ($CuF$ and $CuF_2$).

A semiconductor processing method incorporating a copper cleaning procedure encompassed by the present invention is described with reference to FIGS. 1–3.

Referring first to FIG. 1, a semiconductive material wafer fragment 10 is illustrated at a preliminary processing step. Wafer fragment 10 comprises a semiconductive material substrate 12 having a copper-containing material 14 formed thereover. Substrate 12 can comprise, for example, a monocrystalline silicon wafer having various levels of circuitry formed thereover. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Copper-containing material 14 can comprise, for example, a copper alloy, a copper compound, or elemental copper, and can be formed by, for example, sputter deposition. In particular embodiments, copper-containing material 14 will consist essentially of elemental copper (or consist of elemental copper) and defines a wiring layer for connecting various circuitry components (not shown) associated with fragment 10.

A mass 16 is formed over copper-containing material 14. Mass 16 can comprise, for example, one or more insulative materials. In particular embodiments, mass 16 comprises at least one of a silicon nitride (for example, $Si_3N_4$) and a silicon oxide (for example, $SiO_2$ or a doped oxide, such as, for example, borophosphosilicate glass). The shown mass 16 comprises two layers 18 and 20 which are formed one atop the other. One of layers 18 and 20 can comprise a silicon oxide, and the other of the layers can comprise a silicon nitride. For instance, layer 18 could consist essentially of $Si_3N_4$ (or in particular embodiments consist of $Si_3N_4$) and layer 20 could consist essentially of $SiO_2$ (or in particular embodiments consist of $SiO_2$). Such layers 18 and 20 can be formed by, for example, chemical vapor deposition.

Figure 2:
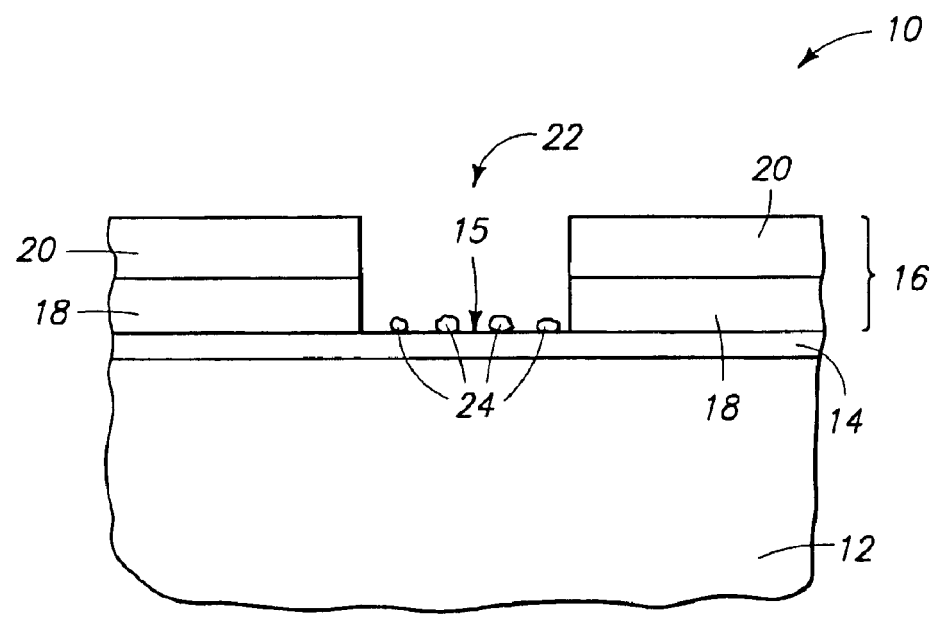
FIG. 2 is a view of the FIG. 1 wafer fragment shown at a processing step subsequent to that of FIG. 1.

Referring to FIG. 2, an opening 22 is etched through mass 16, and specifically is etched through both of layers 18 and 20. Opening 22 can be formed by, for example, photolithographic processing wherein a photoresist masking layer (not shown) is formed over mass 16 and patterned to protect some of mass 16 while leaving a portion of mass 16 exposed to etching conditions which ultimately form opening 22.

Opening 22 extends to an upper surface 15 of copper-containing material 14. Surface 15 defines a base of opening 22, and the portion of surface 15 within opening 22 can be referred to as a base surface.

Base surface 15 is partially covered by contaminating particles 24. Such contaminating particles can comprise, for example, one or more of a copper oxide, a silicon oxide, or a copper fluoride. Additionally, particles 24 can comprise elemental copper leftover from a sputter deposition of copper-containing material 14. The copper oxide, silicon oxide or copper fluoride particles can be formed, for example, during the etch through layers 18 and 20. For instance, the silicon oxide can be formed by either oxidation of a silicon nitride component of mass 16, or by debris occurring during the etch of a silicon oxide component of mass 16. As another example, copper oxide can be formed from portions of copper-containing material 14 exposed to etching conditions, if such conditions comprise oxidative components. As yet another example, copper fluoride can be formed from portions of copper-containing material 14 exposed to etching conditions if such conditions comprise a fluorine-containing etchant such as, for example, $CF_4$.

Although base surface 15 is shown to be only partially covered by contaminating particles 24, it is to be understood that such particles can entirely cover base surface 15. The particles 24 can also be deposited on the sidewalls of opening 22 and on the surface of 20.

Although the contaminating particles 24 are described as being formed during formation of opening 22, it is to be understood that particles 24 could be formed during other processing steps, such as, for example, as residuals from a chemical-mechanical polishing processing step.

Figure 3:
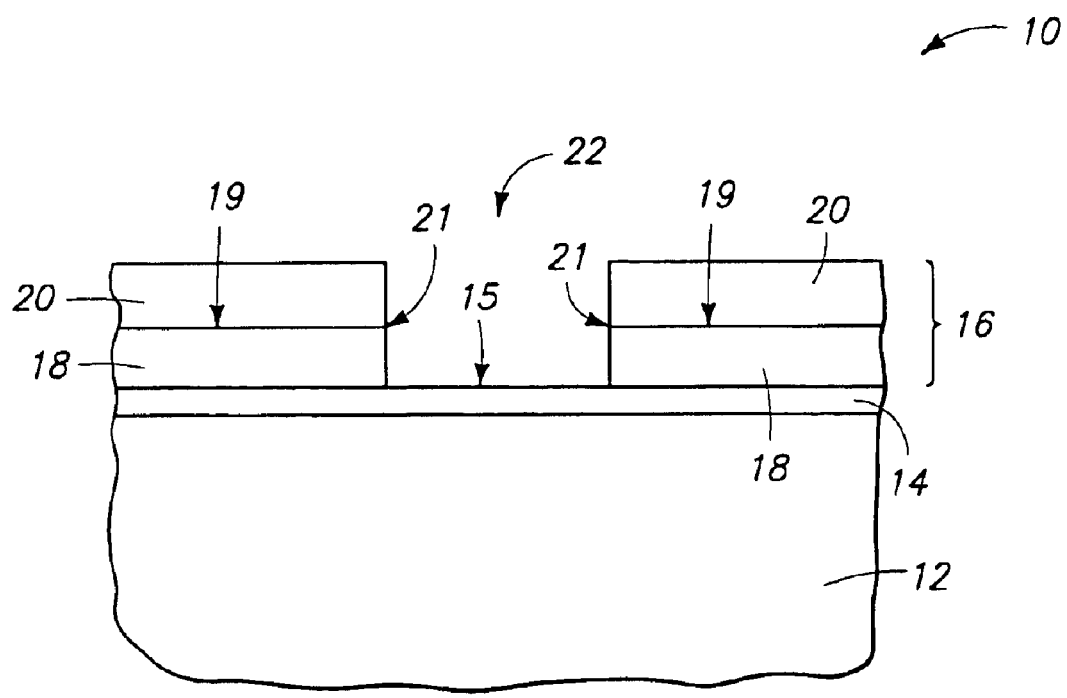
FIG. 3 is a view of the FIG. 1 wafer fragment shown at a processing step subsequent to that of FIG. 2.

Referring to FIG. 3, contaminating particles 24 (FIG. 2) are removed from base surface 15 by cleaning such surface with an acidic mixture comprising $Cl^-$, $NO_3^-$ and $F^-$. More specifically, base surface 15 is cleaned by exposing the surface to the mixture of the present invention which is described above for removing copper oxide, silicon oxide, copper fluoride, and elemental copper from over base surface 15 in one cleaning step. Such cleaning solution preferably is an aqueous mixture comprising non-aqueous components, with the non-aqueous components consisting essentially of $Cl^-$, $NO_3^-$ and $F^-$. The cleaning mixture can have such preferred composition at least until base surface 15 is exposed to the mixture. Once base surface 15 is exposed to the mixture, a composition of the mixture can change to include components released from particles 24 (FIG. 2) during the removal of particles 24 from over base surface 15 with the mixture.

The exposure of base surface 15 to an acidic mixture comprising $Cl^-$, $NO_3^-$ and $F^-$ can occur for a time of from about 30 seconds to about one hour at a temperature of from about 10° C. to about 40° C., and at atmospheric pressure. The temperature can comprise, for example, room temperature (typically from 20° C. to 26° C.).

Relative amounts of $F^-$, $Cl^-$ and $NO_3^-$ within an acidic cleaning mixture of the present invention can be varied depending upon particular cleaning conditions. For instance, if a large amount of silicon oxide contamination is expected to be present, the concentration of $F^-$ can be increased relative to the concentrations of $Cl^-$ and $NO_3^-$. On the other hand, if elemental copper is particularly problematic, the concentration of $NO_3^-$ can be increased relative to the concentrations of $Cl^-$ and $F^-$. Further, if copper oxides are particularly problematic, the concentration of $Cl^-$ can be increased relative to the concentrations of $NO_3^-$ and $F^-$.

Also, it can be desirable to increase the total concentrations of $Cl^-$, $NO_3^-$ and $F^-$ to accomplish faster cleaning of a copper-containing substrate. Faster cleaning can also be accomplished by increasing a temperature of the cleaning solution and/or a temperature of the copper-containing material during a cleaning process.

Relative concentrations of $Cl^-$, $NO_3^-$ and $F^-$ can also be varied to avoid having one or more of the various anions etching non-contaminating portions of wafer fragment 10. For instance, a method of exposing base surface 15 to a cleaning solution of the present invention is to dip a wafer comprising fragment 10 into a cleaning solution of the present invention for a time of about 5 minutes. Such dip would expose layers 18 and 20 to the cleaning solution, as well as exposing base surface 15 to the cleaning solution. If one or both of layers 18 and 20 comprise silicon dioxide, the silicon dioxide would be expected to be etched by $F^-$ present in the cleaning solution. Such etching could alter a configuration of layers 18 and 20 if the concentration of $F^-$ were sufficiently high, or if the time of exposure were sufficiently long. For instance, if an interface 19 is defined at a location where layers 18 and 20 join, and if it is considered that one of layers 18 and 20 is silicon nitride and the other is silicon dioxide, then the exposure to $F^-$ in the cleaning solution may form divots at locations 21 where interface 19 is exposed along sidewalls of opening 22. A method of avoiding such divot formation is to adjust a concentration of $F^-$ within the cleaning solution so that the $F^-$ concentration is only enough to remove contaminating particles 24 from base surface 15. In other words, to adjust the concentration of $F^-$ within the cleaning solution so that there is enough $F^-$ to remove particles 24, but not enough to detrimentally affect exposed silicon oxide surfaces of mass 16 during the time of an etch.

Preferably, if a silicon oxide containing surface of mass 16 is exposed to an acidic cleaning solution of the present invention during a cleaning of base surface 15, the concentration of $F^-$ within the acidic mixture will be such that less than 5 Angstroms of silicon oxide is removed from the exposed surface of mass 16 during the cleaning of the base surface.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of cleaning a surface of a copper-containing material, comprising:
   forming a copper-containing material over a semiconductor substrate;
   forming a first insulative material over the copper-containing material;
   forming a second insulative material over the first insulative material, the first and second insulative materials having an interface therebetween;
   etching an opening through the first insulative material and the second insulative material to expose a surface of the copper-containing material at the base of the opening; and
   exposing the surface of the copper-containing material to a cleaning solution formed from hydrochloric acid, nitric acid and hydrofluoric acid, the exposing removing less than 5 Angstroms of the first and second insulative materials from sidewalls of the opening without forming a divot at the interface.

2. The method of claim 1 wherein the cleaning solution consists essentially of $Cl^-$, $NO3^-$, $F^-$ and equilibrium components of $H_3O^+$ and $H_2O$, at least until the exposing.

3. The method of claim 1 wherein the mixture is an aqueous mixture and wherein the only non-hydroxide anions in the cleaning solution consist essentially of $Cl^-$, $NO_3^-$ and $F^-$, at least until the exposing.

4. The method of claim 1 further comprising, before the exposing, forming the cleaning solution by combining an HCl solution (36%, by weight in water), an HF solution (49%, by weight in water), an $HNO_3$ solution (70%, by weight in water) and $H_2O$; the relative amounts of the combined $H_2O$ and solutions being:
   from about 2.5 parts $H_2O$ per 1 part HCl solution to about 10 parts $H_2O$ per 1 part HCl solution;
   from about 75 parts $H_2O$ per 1 part $HNO_3$ solution to about 300 parts $H_2O$ per 1 part $HNO_3$ solution; and
   from about 150 parts $H_2O$ per 1 part HF solution to about 600 parts $H_2O$ per 1 part HF solution.

5. The method of claim 1 further comprising, before the exposing, forming the cleaning solution by combining $H_2O$ with solutions of HCl (36%, by weight in water), HF (49%, by weight in water) and $HNO_3$ (70%, by weight in water); the relative amounts of the combined $H_2O$ and solutions being about 300 parts $H_2O$; about 60 parts of the HCl solution; about 2 parts of the $HNO_3$ solution; and about 1 part of the HF solution.

6. The method of claim 1 wherein the exposing removes one or more of a copper oxide and a copper fluoride from on the surface.

7. A semiconductor processing method of forming an opening to a copper-containing substrate, comprising:
   providing a copper-containing substrate having a mass thereover, the mass comprising at layer of silicon nitride and a silicon oxide, the copper-containing substrate being supported by a semiconductor material;
   etching an opening through the mass and to the copper-containing substrate, a surface of the copper-containing substrate forming a base of the opening and thus defining a base surface of the opening, said base surface being at least partially covered by at least one of a copper oxide, a silicon oxide or a copper fluoride, the opening having sidewalls comprising silicon oxide, silicon nitride and an interface between the silicon oxide and the silicon nitride; and
   cleaning said base surface with a cleaning solution formed from hydrochloric acid, nitric acid and hydrofluoric acid to remove at least some of the at least one of a copper oxide, a silicon oxide or a copper fluoride from the base surface, the cleaning removing a thickness of less than 5 angstroms of silicon oxide from the sidewalls without formation of a divot at the interface.

8. The method of claim 7 wherein the base surface is at least partially covered by copper oxide, silicon oxide and copper fluoride; and wherein the cleaning removes substantially all of the copper oxide, silicon oxide and copper fluoride from the base surface of the copper-containing substrate.

9. The method of claim 7 wherein the copper-containing substrate consists essentially of elemental copper.

10. The method of claim 7 wherein the cleaning solution consists essentially of $Cl^-$, $NO_3^-$, $F^-$ and equilibrium forms of $H_3O^+$ and $H_2O$, at least until the exposing.

11. The method of claim 7 wherein the mixture is an aqueous mixture and wherein the only non-hydroxide anions in the cleaning solution consist essentially of $Cl^-$, $NO_3^-$ and $F^-$, at least until the exposing.

12. The method of claim 7 further comprising, before the exposing, forming the cleaning solution by combining an HCl solution (36%, by weight in water), an HF solution (49%, by weight in water), an $HNO_3$ solution (70%, by weight in water) and $H_2O$; the relative amounts of the combined solutions and $H_2O$ being:

from about 2.5 parts $H_2O$ per 1 part HCl solution to about 10 parts $H_2O$ per 1 part HCl solution;

from about 75 parts $H_2O$ per 1 part $HNO_3$ solution to about 300 parts $H_2O$ per 1 part $HNO_3$ solution; and from about 150 parts $H_2O$ per 1 part HF solution to about 600 parts $H_2O$ per 1 part HF solution.

* * * * *

UNITED STATES PATENT AND TRADEMARK OFFICE
CERTIFICATE OF CORRECTION

PATENT NO.      : 6,955,995 B2                                   Page 1 of 1
APPLICATION NO. : 10/683801
DATED           : October 18, 2005
INVENTOR(S)     : Morgan It is certified that error appears in the above-identified patent and that said Letters Patent is hereby corrected as shown below:

Item (37) Assignee – Replace "Mircon" with --Micron--.

Column 6, Line 6 – Replace "NO3⁻" with --$NO_3^-$--.

Column 6, Line 41 – Replace "at" with --a--.

Column 6, Line 42 – Replace "and a" with --interfacing a layer of--.

Signed and Sealed this

Fifteenth Day of August, 2006

JON W. DUDAS
*Director of the United States Patent and Trademark Office*